United States Patent
Chen et al.

(10) Patent No.: US 6,274,485 B1
(45) Date of Patent: Aug. 14, 2001

(54) METHOD TO REDUCE DISHING IN METAL CHEMICAL-MECHANICAL POLISHING

(75) Inventors: Feng Chen; Rick Teo, both of Singapore (SG); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/425,310

(22) Filed: Oct. 25, 1999

(51) Int. Cl.$^7$ ............................................... H01L 21/44
(52) U.S. Cl. ..................... 438/652; 438/653; 438/654; 438/656; 438/685; 438/692
(58) Field of Search .................... 438/652, 653, 438/654, 656, 685, 692

(56) References Cited

U.S. PATENT DOCUMENTS

| | | | |
|---|---|---|---|
| 5,356,513 | 10/1994 | Burke et al. | 156/636 |
| 5,578,523 | 11/1996 | Fiordalice et al. | 437/190 |
| 5,763,010 | * 6/1998 | Guo et al. . | |
| 5,776,833 | 7/1998 | Chen et al. | 438/672 |
| 5,798,302 | 8/1998 | Hudson et al. | 438/693 |
| 5,817,574 | * 10/1998 | Gardner . | |
| 5,854,140 | 12/1998 | Jaso et al. | 438/740 |
| 5,886,410 | 3/1999 | Chiang et al. | 257/759 |
| 6,004,188 | * 12/1999 | Roy . | |
| 6,051,500 | * 4/2000 | Maury et al. . | |
| 6,140,224 | * 10/2000 | Lin . | |
| 6,150,260 | * 11/2000 | Roy . | |

FOREIGN PATENT DOCUMENTS 9-167768  *  6/1997  (JP) .

* cited by examiner

*Primary Examiner*—Charles Bowers
*Assistant Examiner*—Stephen W. Smoot
(74) *Attorney, Agent, or Firm*—George O. Saile; Rosemary L. S. Pike

(57) ABSTRACT

A new method of metal plug metallization utilizing a sacrificial high polishing rate layer to prevent dishing and metal residues after CMP is described. An oxide layer is provided overlying semiconductor device structures in and on a semiconductor substrate. A sacrificial high polishing rate (HPR) layer is deposited overlying the oxide layer. An opening is etched through the HPR layer and the oxide layer to one of the semiconductor device structures. A barrier layer and a metal layer are deposited over the surface of the HPR layer and within the opening. The metal layer, barrier layer, and HPR layer overlying the oxide layer are polished away by CMP. The polishing rate of the HPR layer is higher than that of the metal layer with the result that after the HPR layer is completely removed, the metal layer remaining within the opening has a convex shape. The oxide layer is overpolished until endpoint detection is received. Since the metal polishing rate is higher than the oxide polishing rate, the convex shape is made substantially planar during the overpolishing to complete metal plug metallization in the fabrication of an integrated circuit.

36 Claims, 4 Drawing Sheets

METHOD TO REDUCE DISHING IN METAL CHEMICAL-MECHANICAL POLISHING

BACKGROUND OF THE INVENTION

(1) Field of the Invention

The invention relates to a method of metallization in the fabrication of integrated circuits, and more particularly, to a method of polishing a metal layer to form a metal plug without dishing in the manufacture of integrated circuits.

(2) Description of the Prior Art

Tungsten-plug metallization is well-known in the art. A conventional tungsten plug process of the prior art is illustrated in FIG. 1. Referring now to FIG. 1, there is shown semiconductor substrate 10. A contact, via, or trench is patterned into an oxide layer 20 to an underlying region 11. A layer of tungsten 26 is deposited which will form a plug within the opening. Typically, barrier metal layer 24 is deposited underlying the tungsten layer 26. The tungsten and barrier metal layers are then polished using chemical mechanical polishing (CMP) to remove the excess metal material, stopping on the oxide layer, as shown in FIG. 2. Because of the delayed response time of the oxide endpoint detector, some oxide overpolishing occurs. Since the oxide layer has a lower CMP removal rate than tungsten, the oxide overpolishing will result in dishing 27 of the tungsten plug. In some dense areas of some dies, some of the tungsten and barrier metal is not completely polished away when oxide overpolishing occurs in some other areas. Dishing and tungsten/barrier metal residues remaining after CMP can adversely affect the electrical performance of the integrated circuit device. It is desired to prevent dishing after tungsten CMP and to improve contact resistance between the tungsten plug and the metal stack interconnect.

Co-pending U.S. patent application Ser. No. 09/110,419 to Sudipto R. Roy filed on Jul. 6, 1998 discloses a sacrificial or semi-sacrificial titanium nitride layer deposited over the oxide to protect the oxide and to act as an endpoint detector. Polishing rates of the tungsten and the titanium nitride are comparable, resulting in dishing. U.S. Pat. No. 5,578,523 to Fiordalice et al teaches the use of a polish assisting layer over a dielectric layer and under a metal layer deposited within a trench. The polish assisting layer and the metal layer are polished at close to the same rate in the final stages of polishing, thus preventing dishing. U.S. Pat. No. 5,798,302 to Hudson et al teaches a low friction layer under a metal layer wherein the polishing rate of the low friction layer is much lower than that of the metal layer causing the CMP process to stop at the top surface of the low friction layer. U.S. Pat. No. 5,886,410 to Chiang et al discloses a hard mask over a polymer through which a trench is etched and filled with tungsten. The tungsten is polished with a higher selectivity to tungsten than to the underlying hard mask. U.S. Pat. No. 5,854,140 to Jaso et al teaches a metal stop layer under an aluminum trench filling layer. The aluminum is polished to the stop layer, resulting in dishing. Then the stop layer is removed with a very high selectivity to the stop layer over the aluminum layer so that the resulting aluminum is substantially planar. U.S. Pat. No. 5,776,833 to Chen et al teaches a titanium nitride layer under a tungsten plug layer. CMP stops at the titanium nitride layer. The titanium nitride layer is then removes by etching rather than by polishing resulting in a protruding tungsten plug. U.S. Pat. No. 5,356,513 to Burke et al discloses alternating layers of soft polishing material and hard polish stops to provide tungsten plugs having a substantially planar surface.

SUMMARY OF THE INVENTION

A principal object of the present invention is to provide an effective and very manufacturable method of plug metallization including CMP.

Another object of the invention is to provide a method of tungsten plug metallization including CMP.

Yet another object is to provide a method of tungsten plug metallization in which dishing of the plug is prevented.

Yet another object is to provide a method of tungsten plug metallization in which tungsten residues after polishing are eliminated.

A still further object of the invention is to provide a method of plug metallization utilizing a sacrificial high polishing rate layer to prevent dishing of the metal plug.

Another further object of the invention is to provide a method of plug metallization utilizing a sacrificial high polishing rate layer to eliminate metal residues after polishing.

Yet another object of the invention is to provide a method of tungsten plug metallization utilizing a titanium nitride sacrificial high polishing rate layer to prevent dishing of the tungsten plug.

In accordance with the objects of this invention a new method of metal plug metallization utilizing a sacrificial high polishing rate layer to prevent dishing and metal residues after CMP is achieved. An oxide layer is provided overlying semiconductor device structures in and on a semiconductor substrate. A sacrificial high polishing rate (HPR) layer is deposited overlying the oxide layer. An opening is etched through the HPR layer and the oxide layer to one of the semiconductor device structures. A barrier layer and a metal layer are deposited over the surface of the HPR layer and within the opening. The metal layer, barrier layer, and HPR layer overlying the oxide layer are polished away by CMP. The polishing rate of the HPR layer is higher than that of the metal layer with the result that after the HPR layer is completely removed, the metal layer remaining within the opening has a convex shape. The oxide layer is overpolished until endpoint detection is received. Since the metal polishing rate is higher than the oxide polishing rate, the convex shape is made substantially planar during the overpolishing to complete metal plug metallization in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
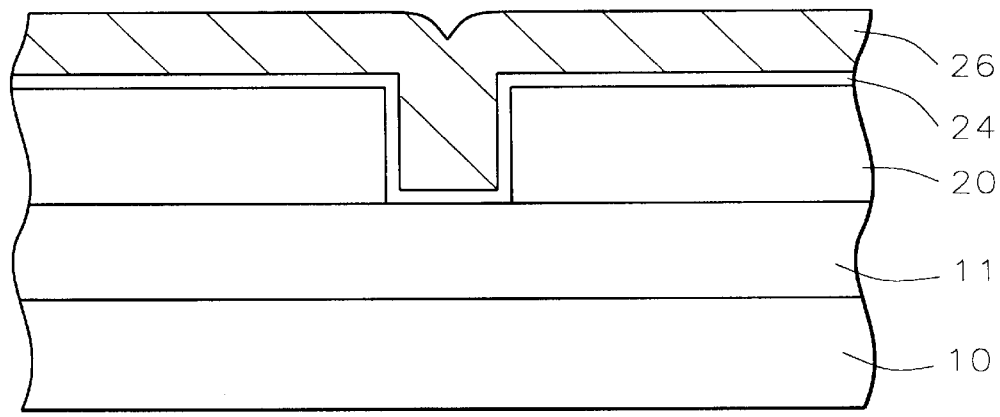
FIGS. 1 and 2 schematically illustrate in cross-sectional representation a conventional tungsten plug process of the prior art.
Figure 2:
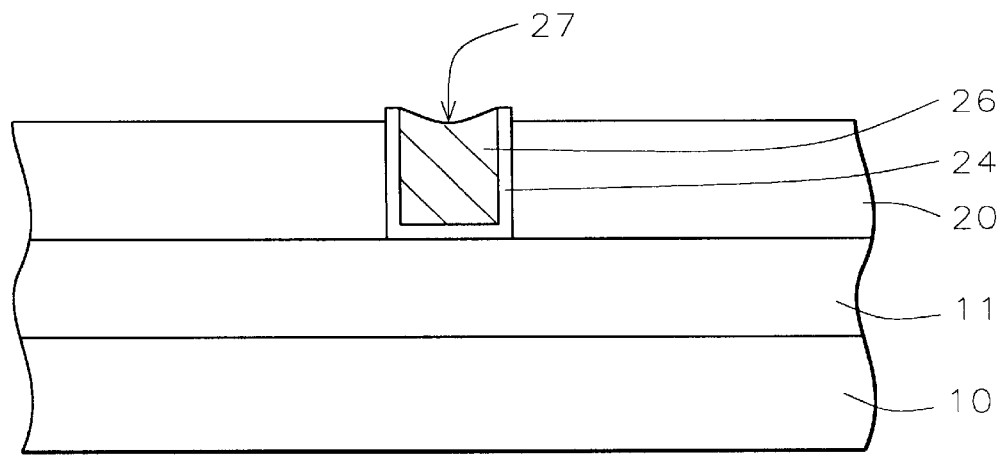
Figure 3:
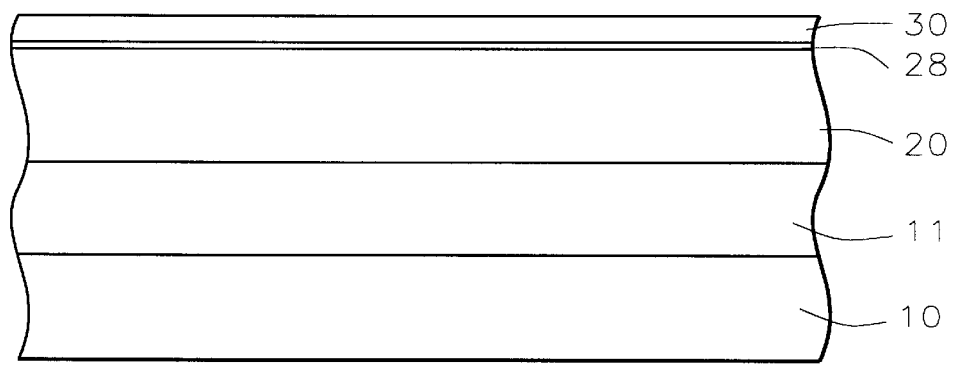
FIGS. 3 through 7 schematically illustrate in cross-sectional representation a preferred embodiment of the present invention.

Referring now more particularly to FIG. 3, there is illustrated a portion of a partially completed integrated circuit. There is shown a semiconductor substrate 10, preferably composed of monocrystalline silicon. Semiconductor device structures, not shown, are formed in and on the semiconductor substrate within the area labeled 11 as is conventional in the art and are covered by a thick insulating layer 20. This insulating layer is typically an oxide, such as silicon dioxide, tetraethoxysilane (TEOS) oxide, borophosphosilicate glass (BPSG), or the like.

A high polishing rate (HPR) layer 30 is deposited overlying the oxide layer. The HPR layer may comprise titanium nitride and is deposited to a thickness of between about 200 and 1000 Angstroms. An adhesion layer comprising titanium 28 optionally may be deposited underlying the HPR layer to a thickness of between about 10 and 50 Angstroms. Since the adhesion layer is so thin, it will not cause dishing problems. The HPR layer acts as a hard mask during patterning of the oxide layer 20.

Figure 4:
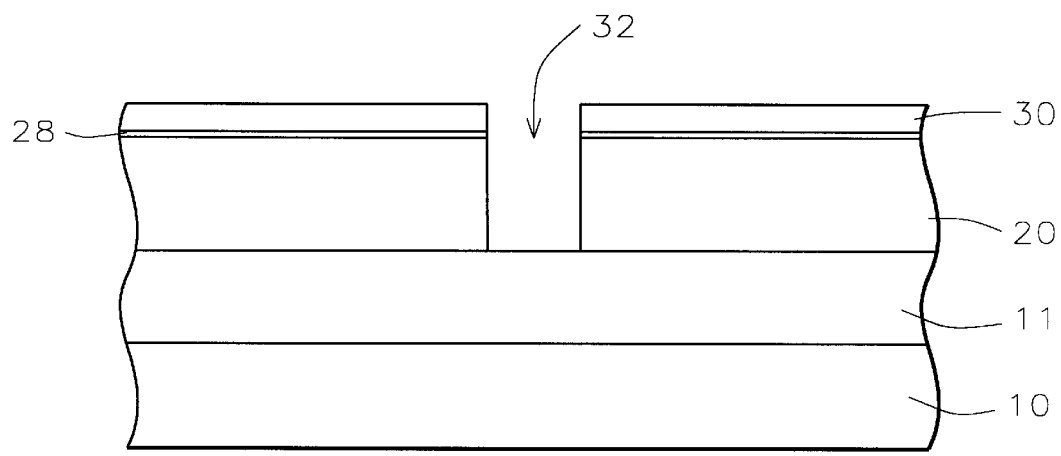

A contact, via, or trench 32 is etched through the HPR layer 30 and the oxide layer 20, as shown in FIG. 4. Typically, the contact or via will be opened to an underlying semiconductor device structure such as a gate electrode, source/drain region, or metal line. The underlying device structure is not shown in the figures.

Figure 5:
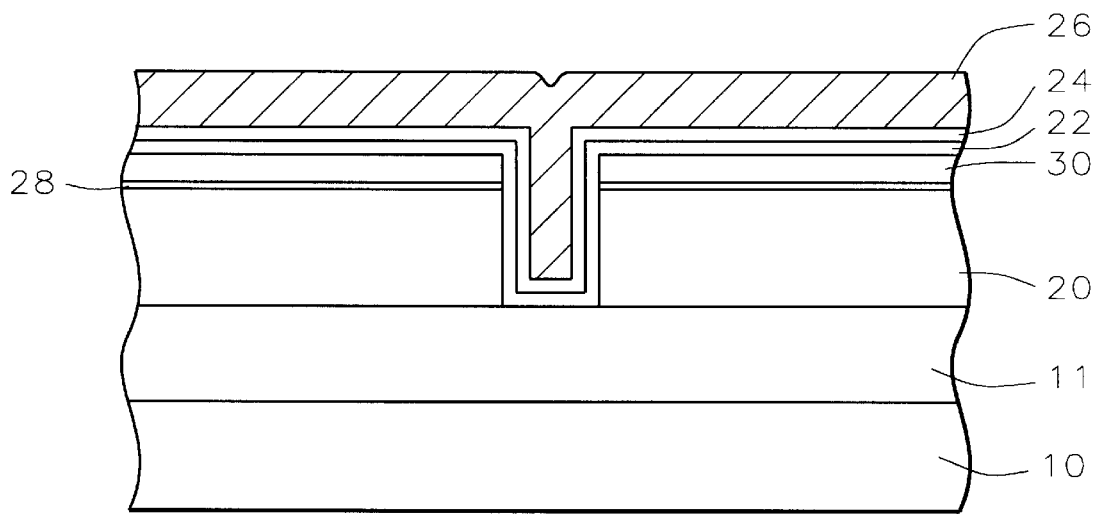

Referring now to FIG. 5, a barrier layer is deposited over the surface of the HPR layer 30 and within the via opening 32. Typically, the barrier layer will comprise a first glue layer 22 preferably composed of titanium and deposited by chemical vapor deposition (CVD) or physical vapor deposition (PVD) to a thickness of between about 100 to 1000 Angstroms. Next, a second barrier layer 24 is deposited conformally over the glue layer 22 by CVD or PVD to a thickness of between about 100 to 1000 Angstroms. The barrier layer may comprise titanium nitride or tantalum nitride.

The metal layer 26 is blanket deposited over the surface of the substrate to a thickness of between about 3000 and 6000 Angstroms and fills the via opening 32. The metal layer is preferably tungsten, copper, or aluminum.

Figure 6:
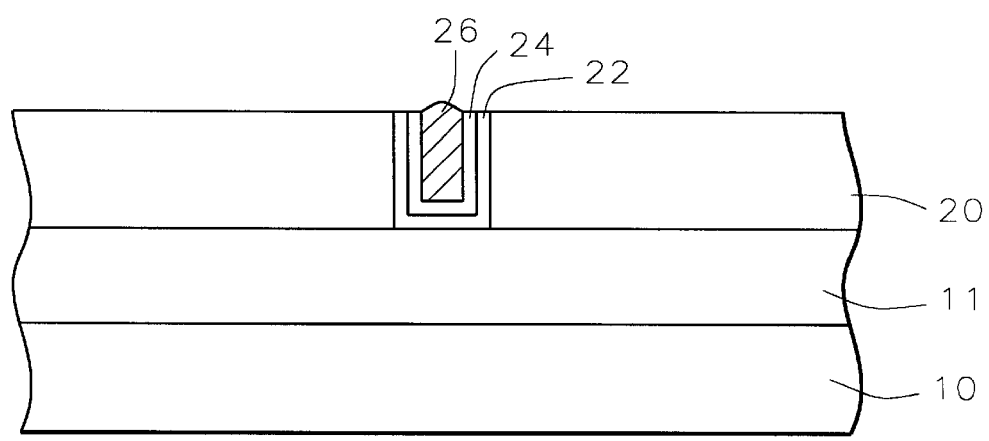

Referring now to FIG. 6, the metal layer 26 is polished using chemical mechanical polishing (CMP) to remove the excess metal overlying the oxide layer. CMP continues until the oxide layer is reached. However, when the HPR layer is reached, the CMP polishing rate of the HPR layer is substantially greater than the polishing rate of the metal layer, resulting in a convex shape of the metal plug, as shown, after the HPR layer is completely removed.

The polish rate selectivity of a preferred polishing slurry, for example, is W:TiN:Ti:Ox of 24:40:10:1. For example, a slurry such as MSW1500 or MSW2000, both by Rodel, may be used. The polishing rate may be, for example, about 3600 Angstroms/minute for tungsten, about 6000 Angstroms/minute for titanium nitride, about 1600 Angstroms/minute for titanium, and about 150 Angstroms/minute for oxide. The polishing rate of the HPR layer is much higher than that of the metal.

Figure 7:
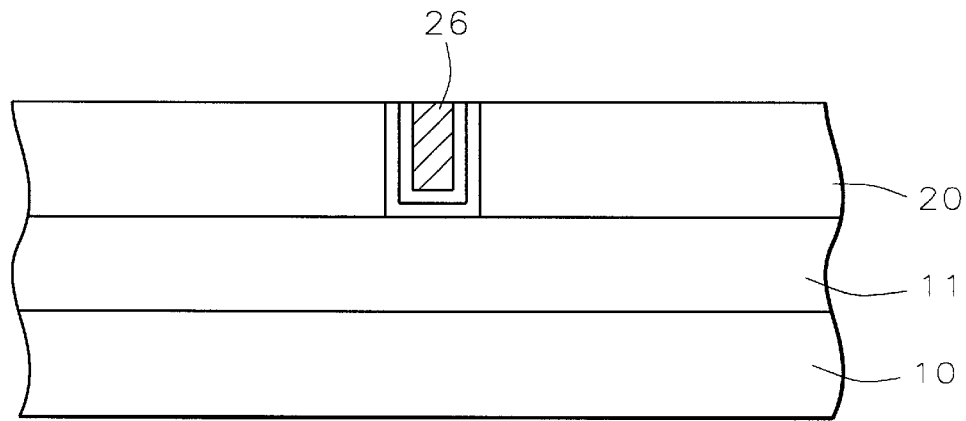

Because of the delay in response time of the endpoint detector, there is some overpolish of the oxide layer 20. Since the metal will be polished away much more quickly than the oxide and since the metal plug 26 has a convex shape when the oxide overpolish begins, the plug will have a substantially planar surface when polishing stops, as shown in FIG. 7.

A further advantage of the present invention is that metal residues can be eliminated. The sacrificial HPR layer is easily removed because of its high polishing rate and can easily take any overlying metal residues with it.

Other processes may now be performed such as an intermetal dielectric deposition and further metallization, as is well known in the art.

Figure 8:
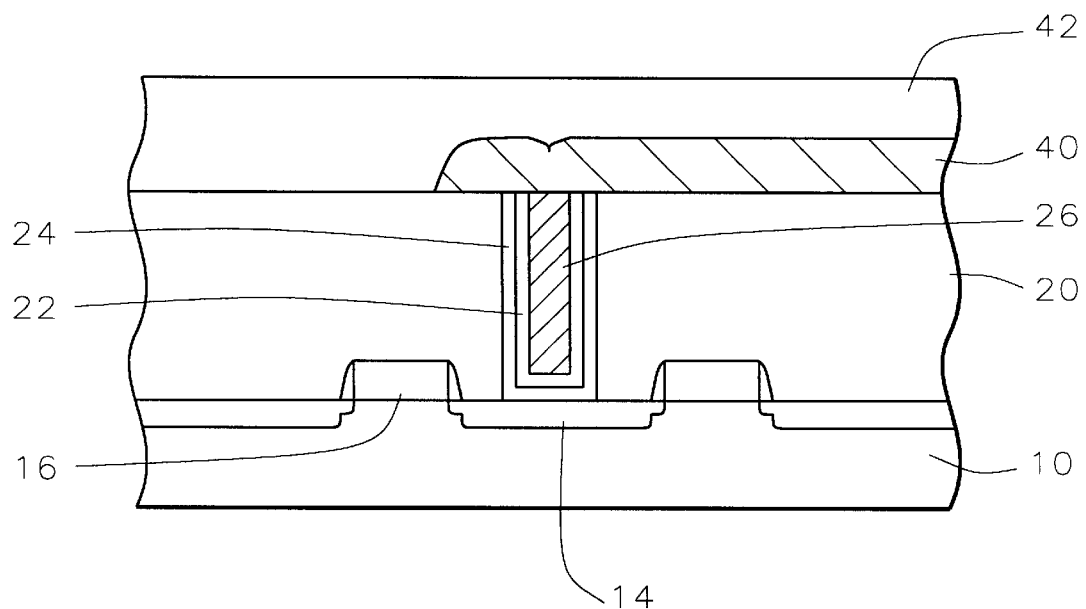
FIG. 8 schematically illustrates in cross-sectional representation a completed integrated circuit device fabricated using the process of the present invention.

FIG. 8 illustrates one example of the use of the metal plug metallization process of the present invention. It will be understood by those skilled in the art, that the process of the invention can be used in any level of metal plug metallization, whether in a via opening contacting a metal line or in a contact opening or trench, as shown in FIG. 8.

For example, as shown in FIG. 8, aluminum line 40 contacts a source/drain region 14 associated with gate electrode 16 through tungsten plug 26 which has been fabricated according to the process of the present invention. The use of the sacrificial HPR layer results in a planarized tungsten plug 26 without dishing or tungsten or barrier metal residue.

The process of the present invention includes the use of a sacrificial high polishing rate layer for metal CMP which causes the formation of an intermediate convex shape of the metal plug which is removed during oxide overpolishing thus preventing dishing. The impact of the invention is the elimination of dishing and metal residue in the metal plug process.

While the invention has been particularly shown and described with reference to the preferred embodiments thereof, it will be understood by those skilled in the art that various changes in form and details may be made without departing from the spirit and scope of the invention.

What is claimed is:

1. A method of forming metal plug metallization in the fabrication of integrated circuits comprising:

providing semiconductor device structures in and on a semiconductor substrate;

providing an insulating layer covering said semiconductor device structures;

depositing a sacrificial layer overlying said insulating layer;

etching an opening through said sacrificial layer and said insulating layer to one of said semiconductor device structures;

depositing a metal layer over the surface of said sacrificial layer and within said opening;

polishing away said metal layer and said sacrificial layer overlying said insulating layer wherein said metal layer has a first polishing rate, said sacrificial layer has a second polishing rate and said insulating layer has a third polishing rate and wherein said second polishing rate is higher than said first polishing rate by a ratio of 5:3 whereby after said sacrificial layer is completely removed, a polished surface of said metal layer remaining within said opening has a convex shape; and over-polishing said insulating layer until endpoint detection is received wherein said first polishing rate is higher than said third polishing rate whereby said convex shape is made substantially planar during said over-polishing to complete said formation of said metal plug metallization in said fabrication of said integrated circuit.

2. The method according to claim 1 wherein said semiconductor device structures include gate electrodes and source and drain regions and wherein said one of said semiconductor device structures to which said opening is etched through said sacrificial layer and said insulating layer is one of said source and drain regions.

3. The method according to claim 1 wherein said semiconductor device structures include gate electrodes and source and drain regions and wherein said one of said semiconductor device structures to which said opening is etched through said sacrificial layer and said insulating layer is one of said gate electrodes.

4. The method according to claim 1 wherein said semiconductor device structures include gate electrodes and source and drain regions and overlying metal lines and wherein said one of said semiconductor device structures to which said opening is etched through said sacrificial layer and said insulating layer is one of said metal lines.

5. The method according to claim 1 wherein said insulating layer comprises tetraethoxysilane (TEOS) oxide.

6. The method according to claim 1 wherein said insulating layer comprises silicon oxide.

7. The method according to claim 1 wherein said sacrificial layer comprises titanium nitride having a thickness of between about 200 and 1000 Angstroms.

8. The method according to claim 1 further comprising depositing a titanium adhesion layer underlying said sacrificial layer to a thickness of between about 10 and 50 Angstroms.

9. The method according to claim 1 further comprising:
depositing a glue layer conformally overlying said sacrificial layer and within said opening; and
depositing a barrier metal layer overlying said glue layer and underlying said metal layer.

10. The method according to claim 9 wherein said glue layer comprises titanium having a thickness of between about 100 and 1000 Angstroms.

11. The method according to claim 9 wherein said barrier metal layer comprises titanium nitride having a thickness of between about 100 and 1000 Angstroms.

12. The method according to claim 1 wherein said metal layer comprises tungsten.

13. The method according to claim 1 wherein said metal layer comprises one of the group consisting of tungsten, copper, and aluminum.

14. The method according to claim 1 wherein said polishing step comprises chemical mechanical polishing.

15. A method of forming metal plug metallization in the fabrication of integrated circuits comprising:
providing semiconductor device structures in and on a semiconductor substrate;
providing an oxide layer covering said semiconductor device structures;
depositing a sacrificial layer overlying said oxide layer;
etching an opening through said sacrificial layer and said oxide layer to one of said semiconductor device structures;
depositing a metal layer over the surface of said sacrificial layer and within said opening;
polishing away said metal layer and said sacrificial layer overlying said oxide layer wherein said metal layer has a first polishing rate, said sacrificial layer has a second polishing rate and said oxide layer has a third polishing rate and wherein said second polishing rate is higher than said first polishing rate by a ratio of 5:3 whereby after said sacrificial layer is completely removed, a polished surface of said metal layer remaining within said opening has a convex shape; and
over-polishing said oxide layer until endpoint detection is received wherein said first polishing rate is higher than said third polishing rate whereby said convex shape is made substantially planar during said over-polishing to complete said formation of said metal plug metallization in said fabrication of said integrated circuit.

16. The method according to claim 15 wherein said semiconductor device structures include gate electrodes and source and drain regions and wherein said one of said semiconductor device structures to which said opening is etched through said sacrificial layer and said oxide layer is one of said source and drain regions.

17. The method according to claim 15 wherein said semiconductor device structures include gate electrodes and source and drain regions and wherein said one of said semiconductor device structures to which said opening is etched through said sacrificial layer and said oxide layer is one of said gate electrodes.

18. The method according to claim 15 wherein said semiconductor device structures include gate electrodes and source and drain regions and overlying metal lines and wherein said one of said semiconductor device structures to which said opening is etched through said sacrificial layer and said oxide layer is one of said metal lines.

19. The method according to claim 15 wherein said oxide layer step comprises tetraethoxysilane (TEOS) oxide.

20. The method according to claim 15 wherein said sacrificial layer comprises titanium nitride having a thickness of between about 200 and 1000 Angstroms.

21. The method according to claim 15 further comprising depositing a titanium adhesion layer underlying said sacrificial layer to a thickness of between about 10 and 50 Angstroms.

22. The method according to claim 15 further comprising:
depositing a glue layer conformally overlying said sacrificial layer and within said opening; and
depositing a barrier metal layer overlying said glue layer and underlying said metal layer.

23. The method according to claim 22 wherein said glue layer comprises titanium having a thickness of between about 100 and 1000 Angstroms.

24. The method according to claim 22 wherein said barrier metal layer comprises titanium nitride having a thickness of between about 100 and 1000 Angstroms.

25. The method according to claim 15 wherein said metal layer comprises tungsten.

26. The method according to claim 15 wherein said polishing step comprises chemical mechanical polishing.

27. A method of forming metal plug metallization in the fabrication of integrated circuits comprising:
providing semiconductor device structures in and on a semiconductor substrate;
providing an oxide layer covering said semiconductor device structures;
depositing an adhesion layer overlying said oxide layer;
depositing a sacrificial layer overlying said adhesion layer;
etching an opening through said sacrificial layer, said adhesion layer, and said oxide layer to one of said semiconductor device structures;
depositing a barrier metal layer over the surface of said sacrificial layer and within said opening;
depositing a metal layer overlying said barrier metal layer;
polishing away said metal layer and said sacrificial layer overlying said oxide layer wherein said metal layer has a first polishing rate, said sacrificial layer has a second polishing rate and said oxide layer has a third polishing rate and wherein said second polishing rate is higher than said first polishing rate by a ratio of 5:3 whereby after said sacrificial layer is completely removed, a polished surface of said metal layer remaining within said opening has a convex shape; and
over-polishing said oxide layer until endpoint detection is received wherein said first polishing rate is higher than said third polishing rate whereby said convex shape is made substantially planar during said over-polishing to complete said formation of said metal plug metallization in said fabrication of said integrated circuit.

28. The method according to claim 27 wherein said semiconductor device structures include gate electrodes and source and drain regions and wherein said one of said semiconductor device structures to which said opening is etched through said sacrificial layer, said adhesion layer, and said oxide layer is one of said source and drain regions.

29. The method according to claim 27 wherein said semiconductor device structures include gate electrodes and source and drain regions and wherein said one of said semiconductor device structures to which said opening is etched through said sacrificial layer, said adhesion layer, and said oxide layer is one of said gate electrodes.

30. The method according to claim 27 wherein said semiconductor device structures include gate electrodes and source and drain regions and overlying metal lines and wherein said one of said semiconductor device structures to which said opening is etched through said sacrificial layer, said adhesion layer, and said oxide layer is one of said metal lines.

31. The method according to claim 27 wherein said oxide layer comprises tetraethoxysilane (TEOS) oxide.

32. The method according to claim 27 wherein said adhesion layer comprises titanium having a thickness of between about 10 and 50 Angstroms.

33. The method according to claim 27 wherein said sacrificial layer comprises titanium nitride having a thickness of between about 200 and 1000 Angstroms.

34. The method according to claim 27 wherein said barrier metal layer comprises a first titanium layer having a thickness of between about 100 and 1000 Angstroms and a second titanium nitride layer having a thickness of between about 100 and 1000 Angstroms.

35. The method according to claim 27 wherein said metal layer comprises one of the group consisting of tungsten, copper, and aluminum.

36. The method according to claim 27 wherein said polishing step comprises chemical mechanical polishing.

* * * * *